US006768952B2

(12) United States Patent
Kantorovich et al.

(10) Patent No.: US 6,768,952 B2
(45) Date of Patent: Jul. 27, 2004

(54) SYSTEM AND METHOD OF MEASURING LOW IMPEDANCES

(75) Inventors: Isaac Kantorovich, Chestnut Hill, MA (US); Christopher Lee Houghton, Westborough, MA (US); James J. St. Laurent, Oakham, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

(21) Appl. No.: 10/274,787

(22) Filed: Oct. 21, 2002

(65) Prior Publication Data

US 2004/0078156 A1 Apr. 22, 2004

(51) Int. Cl.[7] .............................................. G06F 17/14
(52) U.S. Cl. ............................. 702/65; 702/64; 702/77
(58) Field of Search .............................. 702/65, 57, 64,
702/66, 67, 69, 70, 73–79, 106, 124–126,
178, 189–191, 194, 195, 197; 324/600,
76.21, 76.19, 76.39, 76.41, 602, 76.44–76.46,
605, 607, 608; 708/403, 300, 309, 311,
819, 821; 714/23; 713/300, 340, 500

(56) References Cited

U.S. PATENT DOCUMENTS

| 4,196,475 A | | 4/1980 | Hall ............................. 702/65 |
| 5,203,000 A | * | 4/1993 | Folkes et al. ................ 713/340 |
| 5,627,476 A | | 5/1997 | Chambers .................... 324/704 |
| 5,828,822 A | * | 10/1998 | Ernst ............................ 714/23 |
| 5,963,023 A | * | 10/1999 | Herrell et al. ............... 323/265 |
| 6,160,382 A | | 12/2000 | Yoon et al. .................. 320/136 |

FOREIGN PATENT DOCUMENTS

| EP | 0272036 A2 | 6/1988 |
| WO | WO 00/55639 | 9/2000 |

OTHER PUBLICATIONS

Taylor, Greg et al., "An Approach to Measuring Power Supply Impedance of Microprocessors," IEEE, 2001, pp. 211–214, no month.

Isaac Kantorovich, et al., "Measurement of Milliohms of Impedance at Hundred MHz on Chip Power Supply Loop," Electrical Performance on Electronic Packaging Conference, Presented on Oct. 23, 2002, 4 pages.

Chris Houghton, et al., "Modeling and Measurement of the Alpha 21364 Package," Compaq Inspiration Technology, EPEP 2001, Oct. 31, 2001, 29 pages.

Sungjun Chun, et al., "Model to Hardware Correlation for Power Distribution Induced I/O Noise in a Functioning Computer System," Electronic Components & Technology Conference, May 2002, pp. 319–324.

Istvan Novak, "Probes and Setup for Measuring PowerPlane Impedances with Vector Network Analyzer," 1999 High--Performance Systems Design Conference, Feb. 1–4, 1999, pp. 201–215.

Istvan Novak, "Measuring MilliOhms and PicoHenrys in Power–Distribution Networks," 2000 High–Performance System Design Conference, Feb. 1–4, 2000, 14 pages.

* cited by examiner

Primary Examiner—Hal D Wachsman

(57) ABSTRACT

A method of measuring impedance in a system comprises holding a microprocessor in reset mode and providing a clock to the microprocessor at a frequency FCLK while measuring a first current level, providing the clock at frequency FCLK/N while measuring a second current level, where N is a positive integer, measuring the voltage at a plurality of ports in the system a plurality of times to obtain a plurality of sets of voltage measurements while holding the microprocessor in reset mode, toggling the clock frequency between FOLK and FOLK/N, and generating a periodic current waveform. The voltage measurements are averaged. The method further comprises determining and removing clock frequency-dependent noises to generate a filtered average voltage, and determining an impedance by dividing a Fourier component of the filtered average voltage by a Fourier component of the periodic current waveform having alternating first and second current levels.

14 Claims, 4 Drawing Sheets

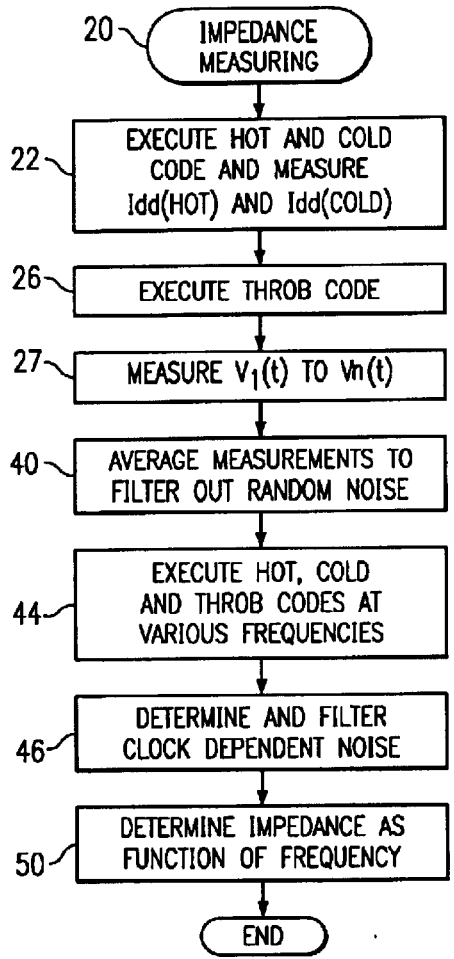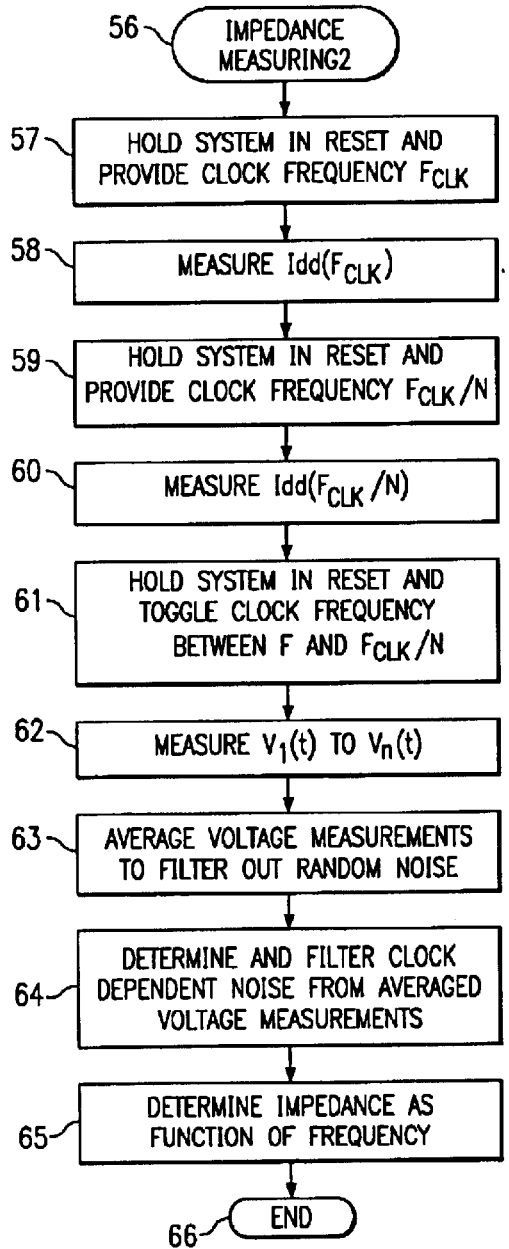

SYSTEM AND METHOD OF MEASURING LOW IMPEDANCES

TECHNICAL FIELD OF THE INVENTION

The present invention relates generally to the field of electronic circuits, and in particular to a method of measuring low impedances.

BACKGROUND OF THE INVENTION

Several factors in the development of computer systems and electronic circuits such as microprocessor chips, printed circuit boards, and electronic packaging contribute to the need for lower impedances over a wide bandwidth in the power distribution networks of these systems. Decreasing power supply levels, signal transition times and die sizes, and the steady increase of power supply currents and clock speeds all require the power distribution network to have very low impedance levels. The typical target impedance for computer systems have decreased by a factor of five every two years. Low impedance in the milliohm and sub-milliohm range is desirable to minimize noise generation, electromagnetic radiation and interference.

While techniques to verify signal integrity of high-speed signals have been widely available, the need to accurately measure very low impedances in the milliohm and sub-milliohm ranges at high frequencies remains unsatisfied. Time-domain reflectometry instruments have been used to measure power distribution network impedances. However, time-domain reflectometry measurements are not suitable for measuring milliohm range impedances due to the noise and nonlinearity of the oscilloscope used in this method. RLC (resistance, inductance and capacitance) meters cannot measure sub-ohm impedances at hundreds of megahertz frequencies. Vector network analyzers have also been used to measure circuit parameters, however they can only access exterior points of a semiconductor chip and cannot measure interior impedances. Furthermore, vector network analyzers measure impedance by supplying and forcing a current into the system, but the current cannot be pushed through the circuit uniformly and achieve satisfactory measurements. A common disadvantage of these conventional methodologies also includes the inability to obtain on-die impedance measurement during system operations.

SUMMARY OF THE INVENTION

In accordance with an embodiment of the present invention, a method of measuring impedance in a system having a microprocessor comprises holding the microprocessor in reset mode and providing a clock to the microprocessor at frequency FCLK while measuring a first current level, providing the clock at frequency FCLK/N and measuring a second current level, where N is a positive integer. While holding the microprocessor in reset and toggling the clock frequency between FCLK and FCLK/N, and generating a periodic current waveform, measuring the voltage at at least one port in the system a plurality of times to obtain a plurality of sets of voltage measurements. The plurality of sets of voltage measurements are averaged. The method further comprises varying FCLK and determining a Fourier component of the averaged voltage measurements to determine clock frequency-dependent noises, and removing the clock frequency-dependent noises to generate a filtered average voltage, and determining an impedance by dividing a Fourier component of the filtered average voltage by a Fourier component of the periodic current waveform having alternating first and second current levels.

In accordance with a further embodiment of the present invention, a method of determining impedance in a system having a microprocessor comprises generating a step waveform in the microprocessor by holding the microprocessor in reset mode and providing a clock to the microprocessor first at frequency $F_{CLK}$ while measuring a first current level, and providing the clock at $F_{CLK}/N$ while measuring a second current level. The method further comprises holding the microprocessor in reset mode, toggling the clock frequency between $F_{CLK}$ and $F_{CLK}/N$, while measuring the voltage at a plurality of ports in the system to obtain a plurality of sets of voltage measurements, and averaging the plurality of sets of voltage measurements. The method comprises varying $F_{CLK}$ and determining clock frequency-dependent noises, and removing the clock frequency-dependent noises to generate a filtered average voltage, and determining an impedance as a function of frequency by dividing a Fourier component of the filtered average voltage by a Fourier component of the periodic current waveform having alternating first and second current levels.

In accordance with yet another embodiment of the present invention, a system comprises means for holding the microprocessor in reset mode and measuring a first current level while providing a clock to the microprocessor at frequency $F_{CLK}$, and measuring a second current level while providing the clock at frequency $F_{CLK}/N$, means for generating a periodic current waveform and measuring the voltage at at least one port in the system a plurality of times to obtain at least one set of voltage measurements while holding the microprocessor in reset mode and toggling the clock frequency between $F_{CLK}$ and $F_{CLK}/N$, and means for averaging the plurality of sets of voltage measurements. The system further comprises means for varying $F_{CLK}$ and determining a Fourier component of the averaged voltage measurements to determine clock frequency-dependent noises, and removing the clock frequency-dependent noises to generate a filtered average voltage, and means for determining an impedance by dividing a Fourier component of the filtered average voltage by a Fourier component of the periodic current waveform having alternating first and second current levels.

BRIEF DESCRIPTION OF THE DRAWINGS

For a more complete understanding of the present invention, the objects and advantages thereof, reference is now made to the following descriptions taken in connection with the accompanying drawings in which:

FIG. 2 is a flowchart of an embodiment of low impedance measurement according to the teachings of the present invention;

FIG. 4 is a flowchart of another embodiment of low impedance measurement according to the teachings of the present invention;

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

Figure 1:
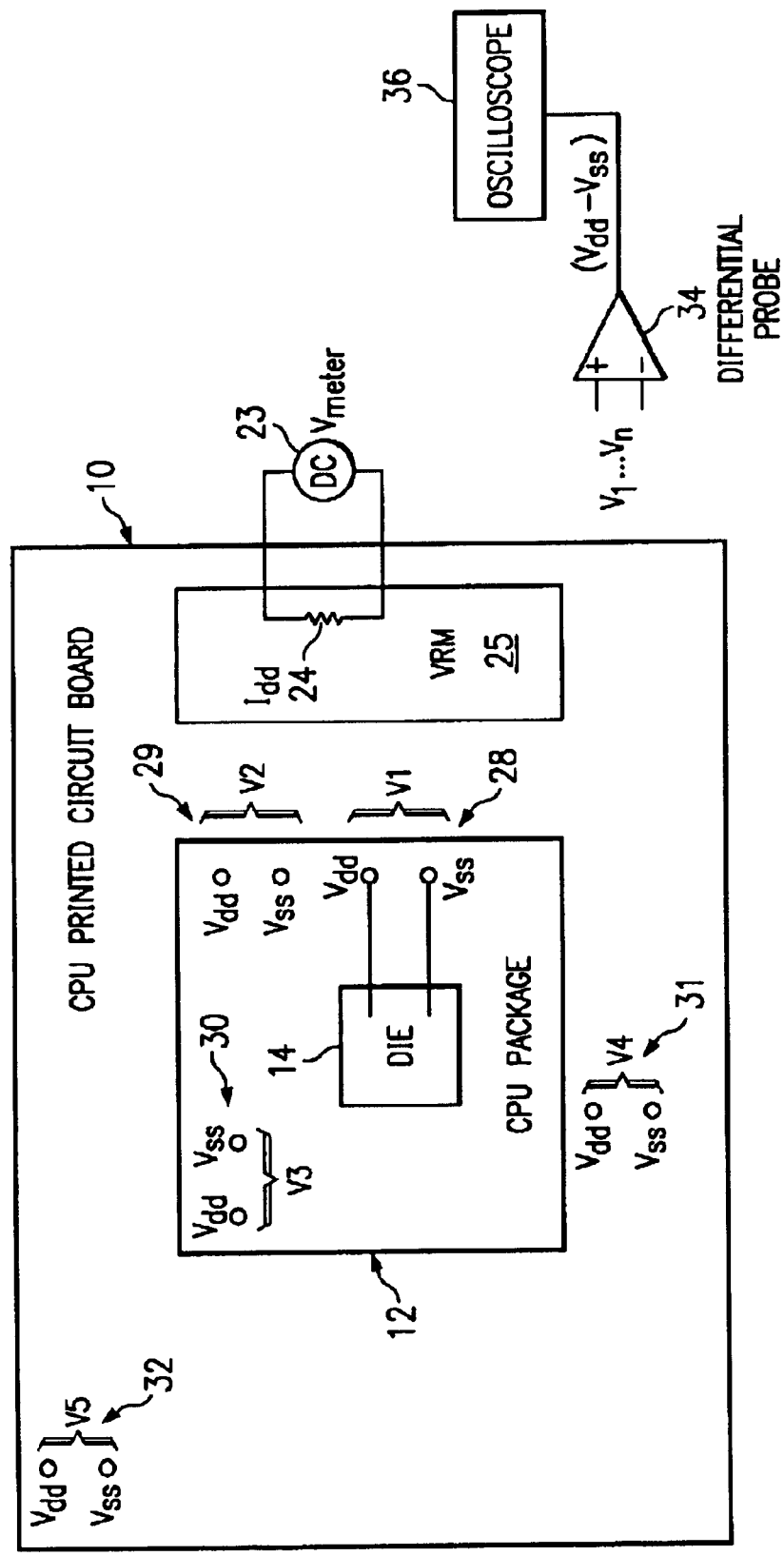
FIG. 1 is a block and schematic diagram of an embodiment of a system of low impedance measurement according to the teachings of the present invention.

FIG. 1 is a block and schematic diagram illustrating an embodiment of a system for measuring low impedance according to the teachings of the present invention. For illustrative purposes, FIG. 1 shows application of a system and method of the present invention to a computer processing unit (CPU) printed circuit board 10, a semiconductor chip package 12 residing on printed circuit board 10, and a semiconductor die 14 inside package 12. Ohm's law, expressed by the following is used for solving for impedance (Z) as a function of frequency:

$$Z(f) = \frac{F_f(V(t))}{F_f(I(t))}$$

where $F_f(g(t))$ is the Fourier component of function g(t) at frequency f, V is voltage, I is current, and t is time. Voltage as a function of time can be accurately measured, but it is very difficult to measure variations of current at the same time. Embodiments of the present invention accomplish this task by generating a current with controllable and known features within the frequency range of interest. The generated current has a simple waveform to avoid introducing additional noise into the measurements.

Three computer algorithms operable to generate a periodic current during microprocessor operations are provided for use during impedance measurements. The current has a simple waveform such as a step or trapezoidal waveform. The computer algorithms each comprise a series of computer instructions. The first algorithm is the HOT code, which comprises a predetermined number of computer instructions, such as four integer addition assembly language instructions, to generate high power. Other computer instructions may also be used, such as integer subtraction, and logical operations such as AND, OR, NOR, XOR, etc. The second algorithm is the COLD code, which comprises a predetermined number of computer operations, such as four integer no-op assembly language instructions, to generate low power. The HOT and COLD codes produce two different constant current levels when executed, where the HOT code generates a higher current than the COLD code. The HOT and COLD codes can be combined alternatively and continuously to create a THROB code. The width of transition between HOT and COLD determines the high frequency boundary of measured impedance. Preferably, the HOT and COLD codes reside in the instruction cache of the microprocessor ready for immediate execution to avoid stalling introduced by fetching instructions. Further, it is desirable to have sufficiently long durations of HOT and then sufficiently long alternate COLD periods to reduce the low frequency boundary. This may be accomplished by introducing loops in the code.

Referring to FIG. 2 for a flowchart of an embodiment of a process for measuring low impedance 20 according to the teachings of the present invention, the HOT code is executed to generate a steady power level so that $I_{dd}$(HOT) can be measured, and execute the COLD code to generate a steady minimum power level so that $I_{dd}$(COLD) can be measured, as shown in block 22 in FIG. 2. $I_{dd}$(HOT) and $I_{dd}$(COLD) may be determined by using a voltmeter 23 coupled to a sense resistor 24 of a voltage regulator module (VRM) 25 located on printed circuit board 10 to measure the voltage drop across resistor 24. In blocks 26 and 27, a THROB code that alternate predetermined lengths of HOT and COLD periods is then executed, and a plurality of voltage measurements, $V_1(t), V_2(t), \ldots V_n(t)$ between $V_{dd}$ and $V_{ss}$ (power and ground) pads 28–32 located on semiconductor die 14, chip packaging 12 and printed circuit board 10. $V_1(t), V_2(t), \ldots V_n(t)$ are also referred to as measured voltage drop at ports 1 through port n below. Voltage $V_1(t)$ at port 1 is a measurement of on-chip voltage drop and is measured by using dedicated test pads specifically provided on-chip for $V_{dd}$-$V_{ss}$ sensing. These test pads are operable to connect with an instrument such as a high-impedance active differential probe 34. The voltage measurements are made with an oscilloscope 36, for example, coupled to differential probe 34.

Figure 5:
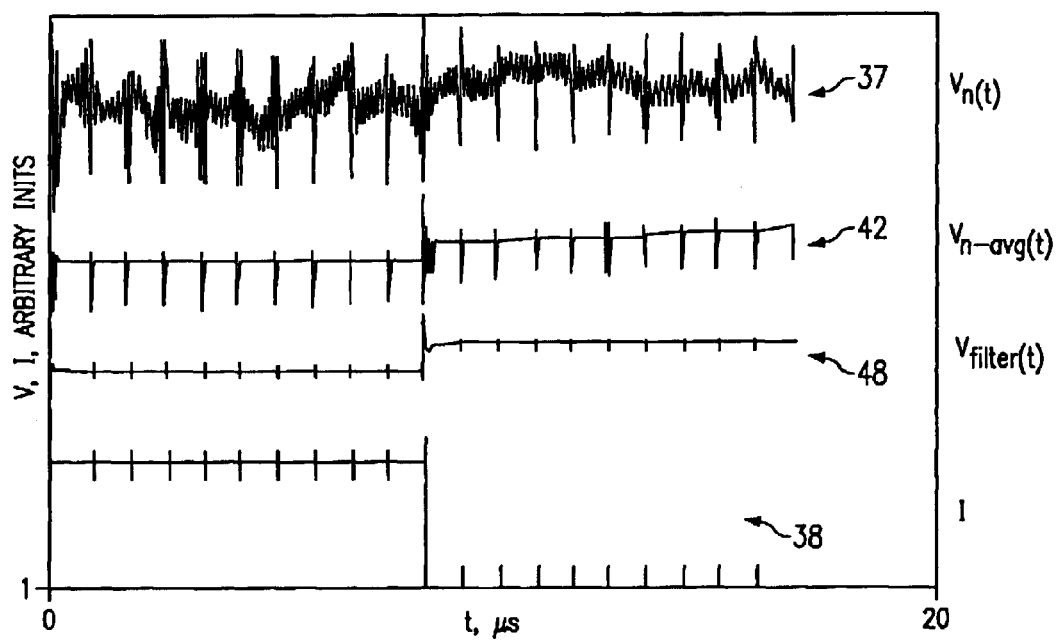
FIG. 5 is a plot of voltage and predicted current and voltage waveforms generated by an embodiment of the COLD, HOT and THROB algorithms according to the teachings of the present invention.

Referring briefly to FIG. 5, an exemplary waveform 37 for $V_1(t)$ is shown. In a preferred embodiment, the THROB code provides a HOT and COLD waveform 38 at a 50% duty cycle and approximately twenty microsecond (µs) period, as shown in FIG. 5. A long-term average math function, provided by oscilloscope 36, is used to average a large number of measurements to reduce random noise, as shown in block 40. An exemplary averaged voltage waveform 42, the result of averaging over 25,000 oscilloscope sweeps, is shown in FIG. 5. Random noise typically originates from sources in the operating environment of the system and is usually arbitrary and aperiodic.

Figure 6:
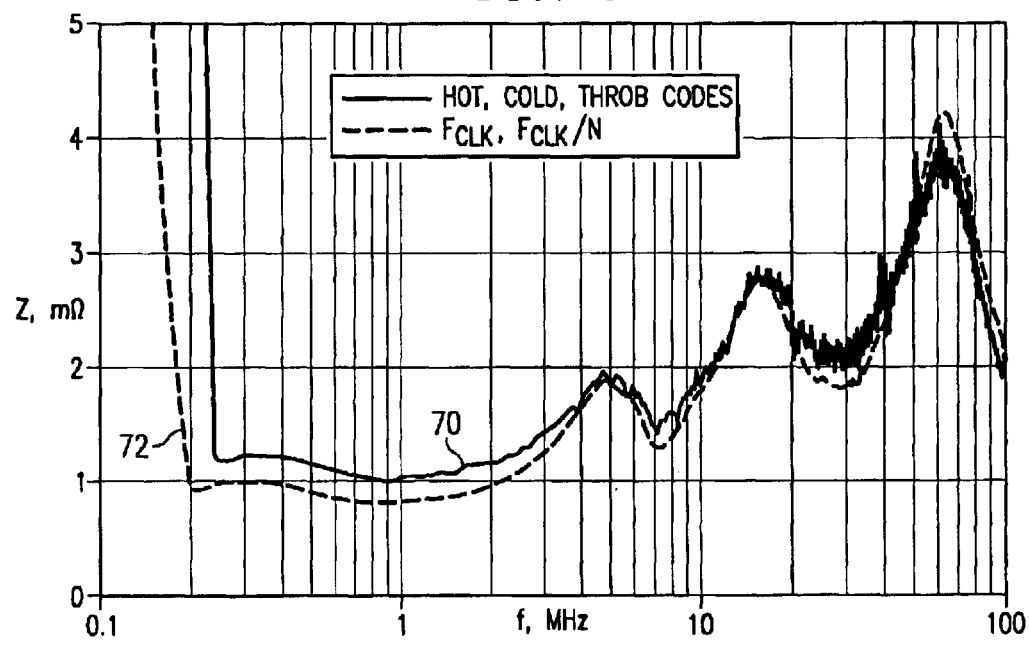
FIG. 6 is a plot of impedance calculations generated by embodiments of the present invention.

Returning to FIG. 2, in block 44, the HOT, COLD, and THROB codes are continuously executed as shown in blocks 22 through 40 at different clock frequencies to measure the currents and voltages at those clock frequencies. By applying Fast Fourier Transform (FET) to obtain the Fourier component of the measured voltage waveform, the periodic noise that varies with changing clock frequencies can be isolated. This clock-dependent noise is then filtered from the averaged voltage measurements, as shown in block 46. The small periodic spikes in the waveform are caused by loop branching in the code. An exemplary filtered average voltage waveform 48 is shown in FIG. 5. In block 50 of FIG. 2, the impedance, $Z_{1i}$ (where i=1 to n), is determined by:

$$Z_{1n}(f) = \frac{F_f(V(t))}{F_f(I(t))}$$

Where $F_f$ is the Fourier component of the voltage or current, and $Z_{11}$ is the impedance of the microprocessor's power supply loop, $Z_{12}$ is the transfer impedance for port 2 on electronic package while the current is predicted for port 1, $Z_{13}$ is the transfer impedance for port 3 on electronic package while the current is predicted for port 1, etc. An exemplary impedance waveform 52 obtained using HOT, COLD and THROB codes over a frequency range of interest is shown in FIG. 6.

It is preferable to provide a number of different THROB codes with different periods to cover a wide frequency range. Step or trapezoidal waveform of larger periods improves measurement accuracy at lower frequencies, and smaller periods improve accuracy at higher frequencies.

Figure 3:
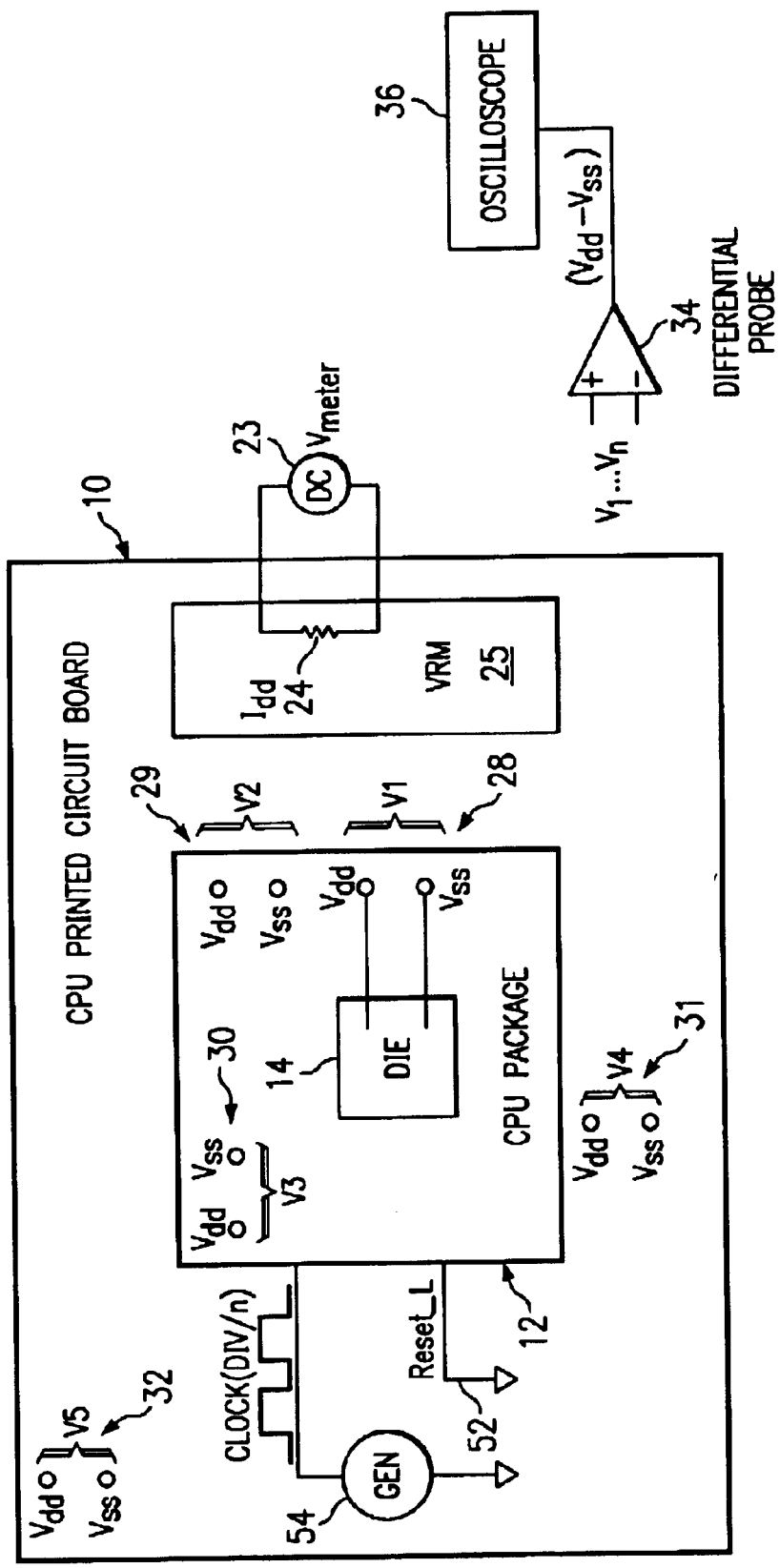
FIG. 3 is a block and schematic diagram of another embodiment of a system of low impedance measurement according to the teachings of the present invention.

FIG. 3 is a block and schematic diagram showing another embodiment of a system of low impedance measurement according to the teachings of the present invention. Rather than using computer codes HOT, COLD and THROB to generate a trapezoidal periodic current waveform, the built-in "divide-by-N" operating mode of the microprocessor chip is used to generate the requisite waveform. The microprocessor is put in reset mode by holding its reset line 52 low while the clock frequency is provided at $F_{CLK}$ or $F_{CLK}$/N, where $F_{CLK}$ is dependent on the microprocessor's operating range, and N is a positive integer. The divide-by-N operating mode is accessible by using the on-chip phase-locked loop (PLL) test mode that normally occurs during the system power up sequence. The period of the trapezoidal current waveform is preferably controlled by using an external pulse generator 54 that provides a waveform at a predetermined duty cycle, such as 50%.

Referring to FIG. 4 for a flowchart of a second embodiment of a low impedance measurement process 56 according to the teachings of the present invention. In blocks 57 and 58, the system is held at reset and the clock frequency is set at $F_{CLK}$ while the $I_{dd}$ current is measured. The system is again held at reset, but the clock frequency is set at $F_{CLK}/N$ while the $I_{dd}$ is again measured, as shown in blocks 59 and 60. In block 62, the system is again held at reset while the clock frequency is toggled between $F_{CLK}$ and $F_{CLK}/N$. Using oscilloscope 36, a plurality of voltages, $V_1$ to $V_n$, are measured from various test pads 28–32 on semiconductor die 14, packaging 12, and printed circuit board 10, as shown in block 63. The $I_{dd}$ currents at $F_{CLK}$ and $F_{CLK}/N$ and the rise and fall times determine the current waveform over time, I(t). The periodic current waveform rise time may be determined by the Fourier transform of the voltage response to the current generated in the divide-by-N mode, and the inverse rise time or the fall time corresponds to the frequency of the minimum of the Fourier transform.

A long-term average math function, provided by oscilloscope 36, is then used to reduce random noise, as shown in block 64. In order to properly filter out random noise, a large number of oscilloscope sweeps are used in the averaging function. Random noise typically originates from sources in the operating environment of the system, and is arbitrary and aperiodic.

Thereafter in block 65, the voltage measurements are obtained at different clock frequencies. By applying Fast Fourier Transform (FFT) to obtain the Fourier component of the measured voltage waveforms at various clock frequencies, the periodic noise that varies with clock frequency can be isolated. For example, the clock frequency can be varied from 1 megahertz (MHz) to 1 gigahertz (GHz). The clock-dependent noise is filtered from the averaged voltage waveform. In block 66, the impedance, $Z_{1i}$ (where I=1 to n), is determined by:

$$Z_{1n}(f) = \frac{F_f(V(t))}{F_f(I(t))}$$

Where $F_f$ is the Fourier component of the voltage or current, and $Z_{11}$ is the impedance of the microprocessor's power supply loop, $Z_{12}$ is the transfer impedance for port 2 on electronic package while the current is predicted for port 1, $Z_{13}$ is the transfer impedance for port 3 on electronic package while the current is predicted for port 1, etc. An exemplary impedance waveform 70 obtained using the frequency-divided-by-N methodology over a frequency range of interest is shown in FIG. 6.

An advantage of current excitation using the divide-by-N methodology over the computer codes includes the elimination of additional noise to the measurements. One of ordinary skill in the art will appreciate that there are noises introduced by the underlying operating system or other sub-components of the system when the microprocessor is operating. Further, the computer codes themselves introduce additional noise that may distort the shape of the current waveform. To avoid random noises associated with the clock, operating system or measuring instrument, a long-term averaging of the voltage waveform using the oscilloscope is desirable, which triggers on the sharp edges of the trapezoidal waveform.

The various embodiments of the present invention described herein provide systems and methods of measuring very low impedances of power supply loops over a wide frequency range at various points on a semiconductor die, in electronic chip packaging, and on a printed circuit board.

What is claimed is:

1. A method of measuring impedance in a system having a microprocessor, comprising:

holding the microprocessor in reset mode and measuring a first current level while providing a clock to the microprocessor at frequency FCLK, and measuring a second current level while providing the clock at frequency FCLK/N, where N is a positive integer;

while holding the microprocessor in reset mode and toggling the clock frequency between FCLK and FCLK/N, generating a periodic current waveform and measuring the voltage at at least one port in the system a plurality of times to obtain at least one set of voltage measurements, and averaging the plurality of sets of voltage measurements;

varying FCLK and determining a Fourier component of the averaged voltage measurements to determine clock frequency-dependent noises, and removing the clock frequency-dependent noises to generate a filtered average voltage; and determining an impedance by dividing a Fourier component of the filtered average voltage by a Fourier component of the periodic current waveform having alternating first and second current levels.

2. The method, as set forth in claim 1, wherein measuring the first and second current levels comprises measuring respective voltage drops on a sense resistor in a voltage regulator in the system.

3. The method, as set forth in claim 1, wherein measuring the voltage at at least one port comprises measuring voltage at power and ground pads located on a semiconductor die of the microprocessor, a packaging of the microprocessor, and a printed circuit board of the system.

4. The method, as set forth in claim 1, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

5. The method, as set forth in claim 1, wherein generating a periodic current waveform comprises generating a step waveform.

6. The method, as set forth in claim 1, wherein generating a periodic current waveform comprises generating a trapezoidal waveform.

7. A method of determining impedance in a system having a microprocessor, comprising:

generating a step waveform in the microprocessor by holding the microprocessor in reset mode and providing a clock to the microprocessor at frequencies FCLK and FCLK/N while measuring respective first and second current levels at frequencies FCLK and FCLK/N, where N is a positive integer;

measuring the voltage at a plurality of ports in the system to obtain a plurality of sets of voltage measurements while holding the microprocessor in reset mode and toggling the clock frequency between FCLK and FCLK/N, and then averaging the plurality of sets of voltage measurements;

varying FCLK and determining clock frequency-dependent noises, and removing the clock frequency-dependent noises to generate a filtered average voltage; and determining an impedance as a function of frequency by dividing a Fourier component of the filtered average voltage by a Fourier component of the step waveform having alternating first and second current levels.

8. The method, as set forth in claim 7, wherein measuring the voltage at a plurality of ports comprises measuring the voltage at power and ground pads located on a semiconductor die of the microprocessor, a packaging of the microprocessor, and a printed circuit board of the system.

9. The method, as set forth in claim 7, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

10. The method, as set forth in claim 7, wherein generating a step waveform comprises generating a trapezoidal waveform.

11. A system of determining very low impedance in a target system, comprising:

means for holding a microprocessor in reset mode and measuring a first current level while providing a clock to the microprocessor at frequency FCLK, and measuring a second current level while providing the clock at frequency FCLK/N, where N is a positive integer;

means for generating a periodic current waveform and measuring the voltage at at least one port in the system a plurality of times to obtain at least one set of voltage measurements while holding the microprocessor in reset mode and toggling the clock frequency between FCLK and FCLK/N;

means for averaging the plurality of sets of voltage measurements;

means for varying FCLK and determining a Fourier component of the averaged voltage measurements to determine clock frequency-dependent noises, and removing the clock frequency-dependent noises to generate a filtered average voltage; and means for determining an impedance by dividing a Fourier component of the filtered average voltage by a Fourier component of the periodic current waveform having alternating first and second current levels.

12. The system, as set forth in claim 11, wherein the means for holding a microprocessor comprises means for measuring respective voltage drops on a sense resistor in a voltage regulator.

13. The system, as set forth in claim 11, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

14. The system, as set forth in claim 11, wherein averaging the plurality of sets of voltage measurements comprises averaging the voltage measurements using an oscilloscope coupled to the at least one port.

* * * * *